(12) United States Patent
Kang et al.

(10) Patent No.: US 7,838,790 B2
(45) Date of Patent: Nov. 23, 2010

(54) MULTIFUNCTIONAL HANDLER SYSTEM FOR ELECTRICAL TESTING OF SEMICONDUCTOR DEVICES

(75) Inventors: Seong-goo Kang, Cheonan-si (KR); Jun-ho Lee, Yongin-si (KR); Ki-sang Kang, Yongin-si (KR); Hyun-seop Shim, Incheon (KR); Do-young Kam, Suwon-si (KR); Jae-il Lee, Yongin-si (KR); Ju-il Kang, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 426 days.

(21) Appl. No.: 11/983,635

(22) Filed: Nov. 9, 2007

(65) Prior Publication Data
US 2008/0110809 A1 May 15, 2008

(30) Foreign Application Priority Data
Nov. 10, 2006 (KR) ...................... 10-2006-0111223

(51) Int. Cl.
*B07C 5/34* (2006.01)
(52) U.S. Cl. ...................... 209/573; 414/935
(58) Field of Classification Search .................. 209/3.3, 209/571–573; 324/158.1; 438/14; 414/935
See application file for complete search history.

(56) References Cited

U.S. PATENT DOCUMENTS 6,066,822 A  5/2000  Nemoto et al.

FOREIGN PATENT DOCUMENTS

| JP | 08-233901 | 9/1996 |
| KR | 20020005877 | 10/2000 |
| KR | 10-2000-0066770 A | 11/2000 |

*Primary Examiner*—Joseph C Rodriguez
(74) *Attorney, Agent, or Firm*—Mills & Onello, LLP

(57) ABSTRACT

A multifunctional handler system for electrical testing of semiconductor devices is provided. The multifunctional handler system comprises: (1) a semiconductor device processing section comprising a loading unit including a buffer, a sorting unit including a separate marking machine, and a unloading unit; (2) a semiconductor device testing section, separate from the semiconductor device processing section, comprises a test chamber, the test chamber is separated into two or more test spaces, and the test spaces of the test chamber include a second chamber positioned at a lower position, a first chamber positioned above the second chamber, and pipelines for connecting the first and second chambers to each other; and (3) a host computer which is independently connected to the semiconductor device processing section and the semiconductor device testing section and controls tray information, test results, marking information, and test program information.

21 Claims, 12 Drawing Sheets

MULTIFUNCTIONAL HANDLER SYSTEM FOR ELECTRICAL TESTING OF SEMICONDUCTOR DEVICES

CROSS-REFERENCE TO RELATED PATENT APPLICATION

This application claims priority under 35 U.S.C. §119 to Korean Patent Application No. 10-2006-0111223, filed on Nov. 10, 2006, in the Korean Intellectual Property Office, the disclosure of which is incorporated herein in its entirety by reference.

BACKGROUND OF THE INVENTION

1. Field of the Invention

The present invention relates to a test system used for electrical testing of semiconductor devices, and more particularly, to a multifunctional handler system for electrical testing of semiconductor devices, which includes a handler, a marking machine, and a host computer.

2. Description of the Related Art

A handler used for electrical testing of semiconductor devices is an automatic process robot used for electrical testing of a semiconductor device. The handler loads a semiconductor device into a test system, connects it to a tester, sorts it according to its test results, and unloads it from the system.

The function and structure of the handler has been continuously developed and improved to test a number of semiconductor devices simultaneously, such as memory devices. Since parallel testing directly improves productivity, handler manufacturers and users have conducted much research to enhance the test efficiency.

FIG. 1 is a perspective view of a general handler system.

Referring to FIG. 1, a single tester 10 for testing semiconductor devices with a memory function is generally connected to two handlers 20A and 20B. A plurality of semiconductor devices is tested in each handler.

Each of the prior art handlers 20A and 20B includes a loading unit which holds a plurality of semiconductor devices in a tray; a soak chamber for aging the test tray transferred from the loading unit, at a predetermined temperature; a test chamber for directly connecting the test tray transferred from the soak chamber to the tester for electrical testing; a de-soak chamber for aging the test tray completing the electrical test, at room temperature; and a sorting and unloading unit for sorting the tested semiconductor devices according to the results of the electrical testing in the test chamber and unloading the sorted devices.

However, since prior art handlers load and test the semiconductor devices in a 'last in, first out' sequence rather than a 'first in, first out' sequence of test trays, another test tray containing one lot of semiconductor devices cannot be loaded until the first test tray containing one lot of semiconductor devices has been tested. Accordingly, it is difficult to continuously operate the handler system.

Moreover, in prior art handlers, the test chamber part, where the electrical testing of the semiconductor devices is performed, is integrated with the loading and sorting and unloading units. So, when either the test chamber part or the loading and sorting and loading units is out of order, the operation of the whole handler system must stop, and repairs are very difficult due to the test chamber's small space. Moreover, since the test chamber part has a faster processing speed than the loading and sorting and unloading units, there are limits to enhancing the test efficiency of the handler system.

Also, when a number of semiconductor devices is tested in the test chamber, a constant temperature is not maintained inside the test chamber, due to the heat generated by the semiconductor devices.

SUMMARY OF THE INVENTION

In accordance with aspect of the present invention, there is provided a multifunctional handler system for electrically testing semiconductor devices, in which a testing part of a handler is separate from a loading and sorting part of the handler. The handler is connected to a host computer so that the handler directly marks the name of a product. Even if an error occurs in a tray inside the handler, the handler does not stop operating. And when a number of semiconductor devices are tested, a substantially constant temperature is maintained inside the test chamber.

According to an aspect of the present invention, there is provided a multifunctional handler system for electrically testing semiconductor devices. The multifunctional handler system comprises a semiconductor device processing section that includes: a loading unit having a separate buffer configured to receive trays of semiconductor devices; a sorting unit adjacent to the loading unit and configured to sort a set of semiconductor devices in a tray after testing, and an unloading unit configured to unload the sorted semiconductor devices from the tray and external to the semiconductor device processing section. Also includes is a semiconductor device testing section configured to test the set of semiconductor devices in the test tray, separate from the semiconductor device processing section, that includes a test chamber configured to perform parallel testing of the semiconductor devices, the test chamber is separated into two or more test spaces, wherein each of the test spaces includes a first chamber positioned adjacent to a second chamber and pipelines connecting the first and second chambers to each other. And a host computer coupled to the semiconductor device processing section and the semiconductor device testing section and configured to control tray information, test results, marking information, and test program information.

The loading unit can be configured to enable the trays to be received using a 'first in, first out' sequence.

The separate buffer of the loading unit can comprise: a first buffer where normal trays are loaded; and a second buffer where trays with an error, which occurs during a process of loading the semiconductor devices into the trays, are loaded.

The unloading unit of the semiconductor device processing section can be configured to enable trays to be received using a 'first in, first out' sequence.

The two or more test spaces of the test chamber can be formed by a partition composed of a heat insulating material.

The loading unit and the sorting unit can comprise a tray error sensing unit configured to sense a tray error, the tray error sensing unit disposed in a path through which the trays are transferred.

The tray error sensing unit can comprise at least one of a camera and a sensor.

The sorting unit can further comprise a marking machine configured to mark a proper product name on each of the set of semiconductor devices in the tray and to receive test results of corresponding to the semiconductor devices from the host computer.

The marking machine can be a laser marking machine.

The semiconductor device testing section can comprise: a soak chamber configured to age the semiconductor devices one or more tray loaded by the loading unit, at a predetermined temperature; a test chamber configured to test the semiconductor devices in the one or more trays aged in the soak chamber; and a de-soak chamber adjacent to and aligned with the soak chamber and configured to return the semiconductor devices in the one or more trays tested in the test chamber to a normal temperature.

The test chamber can comprise: a second chamber positioned at a lower position, where a liquid coolant is circulated; a first chamber positioned above the second chamber and connected to the second chamber through first and second pipelines, the first chamber including a contact drive plate, a thermoelectric element panel, a thermoelectric pad and a match plate inside; a test board positioned to be adjacent to the first chamber; and at least one pressure applying device, positioned to be adjacent to the second chamber, and configured to press the semiconductor devices loaded on the test board.

The liquid coolant can be ethanol.

The thermoelectric element panel of the first chamber can be composed of a material producing the Peltier effect.

The second chamber can further comprise a heat sink configured to emit heat external to the test chamber.

A medium can be moved through the first and second pipelines of the test chamber, using a temperature difference of the medium.

The pipelines of the test chamber can be a first pipeline configured to supply a medium at a predetermined temperature from the second chamber to the contact drive plate adjacent to the first chamber; and a second pipeline configured to return the medium from the contact drive plate adjacent to the first chamber to the second chamber.

The semiconductor device processing section can further comprise a tray transferring unit connecting the semiconductor device processing section to the semiconductor device testing section.

The semiconductor device testing section can further comprise a tray transferring unit connecting the semiconductor device testing section to the semiconductor device processing section.

The tray transferring unit can be a conveyer system.

The at least one pressure applying device can be two or more.

BRIEF DESCRIPTION OF THE DRAWINGS

Various aspects of the invention will become more apparent in view of the attached drawing figures, which are provided by way of example, not by way of limitation, wherein like elements are represented by like reference numerals, in which.

DETAILED DESCRIPTION OF THE INVENTION

Hereinafter, various aspects and embodiments of the present invention will be described in detail by explaining embodiments of the invention with reference to the attached drawings. The present invention can, however, be embodied in different forms and should not be constructed as limited to the embodiments set forth herein.

It will be understood that, although the terms first, second, etc. can be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 2:
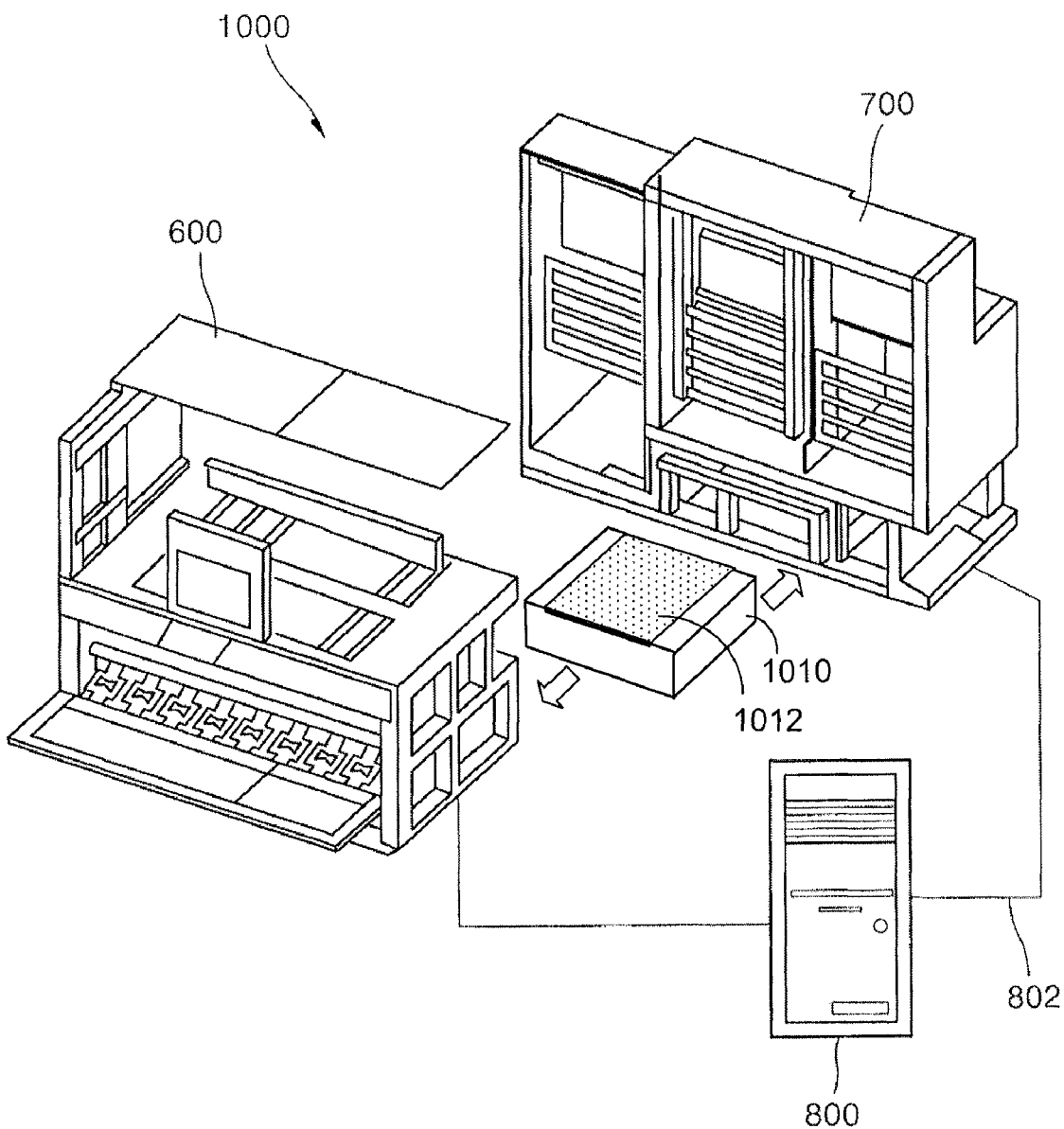
FIG. 2 is a perspective view of an embodiment of a multi-functional handler system for electrical testing of semiconductor devices, according to aspects of the present invention.

FIG. 2 is a perspective view of an embodiment of a multifunctional handler system 1000 for electrical testing of semiconductor devices, according to aspects of the present invention.

Referring to FIG. 2, the multifunctional handler system 1000 for electrical testing of semiconductor devices comprises a semiconductor device processing section 600 including a loading unit for loading semiconductor devices placed in a tray (or test tray), a sorting unit for sorting the tested semiconductor devices according to the test results, and a unloading unit for unloading the sorted semiconductor devices from the tray and external to the handler system 1000.

The handler system 1000 for electrical testing of semiconductor devices also comprises a semiconductor device testing section 700 which is structurally separate from the semiconductor device processing section 600. The semiconductor device testing section 700 includes a soak chamber for aging the semiconductor devices loaded in the tray at a predetermined temperature; a test chamber for testing the semiconductor devices aged in the soak chamber; and a de-soak chamber adjacent to and aligned with the soak chamber configured to return the tested semiconductor devices to a normal temperature, such as room temperature. These will be described in detail below, with reference to the drawings.

The handler system 1000 comprises a host computer 800 which is connected to the semiconductor device processing section 600 and the semiconductor device testing section 700 through a signal line 802. Host computer 800 manages tray information, test results, marking information, and test program information.

Accordingly, the handler system 1000 has a structure which allows the semiconductor device processing section 600 and the semiconductor device testing section 700 to operate independently. A tray transfer unit 1010, such as a conveyer system, can be connected between the semiconductor device processing section 600 and the semiconductor device testing section 700. The tray transfer unit can be installed in or between any one of the semiconductor device processing section 600 and the semiconductor device testing section 700.

In the handler system 1000, the semiconductor device processing section 600 is separated from the semiconductor device testing section 700. Accordingly, if a jam occurs in one of the semiconductor device processing section 600 and the semiconductor device testing section 700, only the section having the jam is stopped, not both, thereby enhancing the test efficiency of the handler system 1000. Further, considering the processing capacity of the semiconductor device processing section 600 and semiconductor device testing section 700, one semiconductor device testing section 700 can be connected to two semiconductor device processing sections 600, in some embodiments. Or, in other embodiments, two semiconductor device testing sections 700 can be connected to one semiconductor device processing section 600.

In various embodiments, the tray can be transferred using any of a variety of types of transfer equipment, such as an automated guideline vehicle (AGV), a railed guideline vehicle (RGV), or an overhead transport (OHT). While such types of transfer equipment have been used in semiconductor packaging processes, they have not been used in such tray transfer units 1010, which usually include a conveyer 1012.

Figure 3:
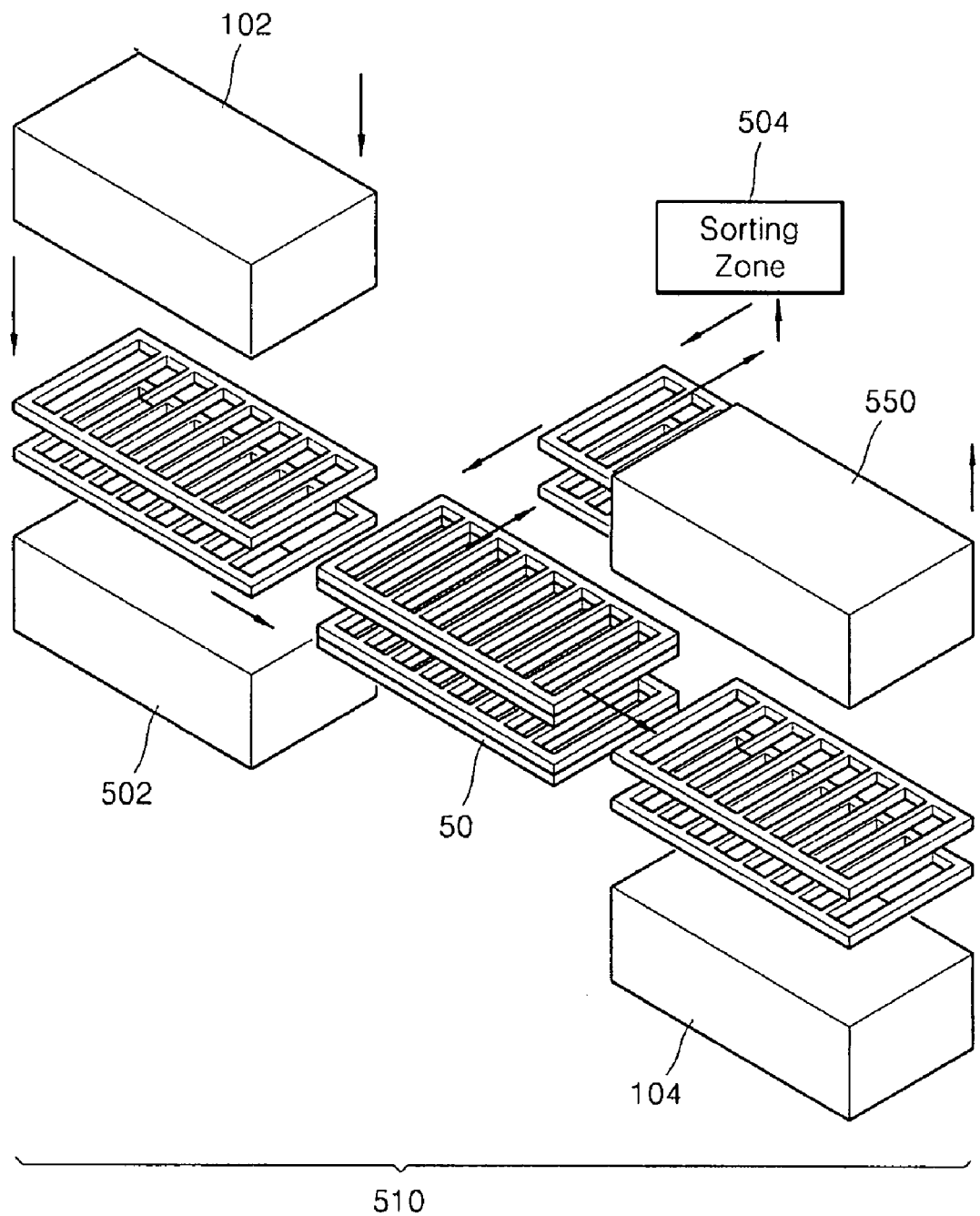
FIG. 3 is a perspective view illustrating the concept of 'first in, first out' of trays used in various embodiment of a semiconductor device processing section, according to aspects of the present invention.

FIG. 3 is a perspective view illustrating the concept of 'first in, first out' of a tray that can be used in a loading unit 510 of the semiconductor device processing section 600, according to aspects of the present invention.

Referring to FIG. 3, in this embodiment trays 50 are initially loaded in a loading station 102 of the loading unit 510, the trays 50 are then moved out of the loading station 102 from the bottom, one by one, to be processed. In the prior art handler, since the trays 50 are taken out from the top and transferred to the semiconductor device testing section, the method of 'first in, first out' cannot be applied. Consequently, in the prior art handler, it is difficult to load another lot until the electrical testing of one lot is completed. However, in accordance with aspects of the present invention, this problem is eliminated. In the preferred embodiment, the method of 'first in, first out' is also used by both an unloading unit 550 and a sorting buffer 502; the sorting buffer 502 is part of the sorting unit 500 (see FIG. 5). That is, in the unloading unit 550, the trays 50 are received and then moved up to be unloaded (e.g., output) external to the semiconductor device processing section 600, one by one, thereby realizing the method of 'first in, first out'.

In the multifunctional handler system 1000 in which the semiconductor device processing section 600 is separated from the semiconductor device testing section 700, the semiconductor device processing section operates the sorting buffer 502 and a loading buffer 104 independently. The sorting buffer 502 and the loading buffer 104 are capable of maintaining a predetermined quantity of trays 50 being loaded, thereby securing adaptability in operating the multifunctional handler system 1000.

The trays 50 can each include an identification unit, such as an RF-tag. The multifunctional handler system 1000 can include an RF tag reader to identify the RF tag in a path through which each tray 50 is transferred. In the prior art handler, a lot is used as a standard unit of the semiconductor device processing. However, in accordance with aspect of the present invention, as the RF tag of the tray is identified in the host computer, the tray is used as a standard unit of the semiconductor device processing. Based on tray information, test results, marking information, and test program information are applied to each tray 50. In FIG. 3, reference number 504 indicates a sorting zone where, after testing a tray 50, the semiconductor devices in the tray are sorted.

Figure 4:
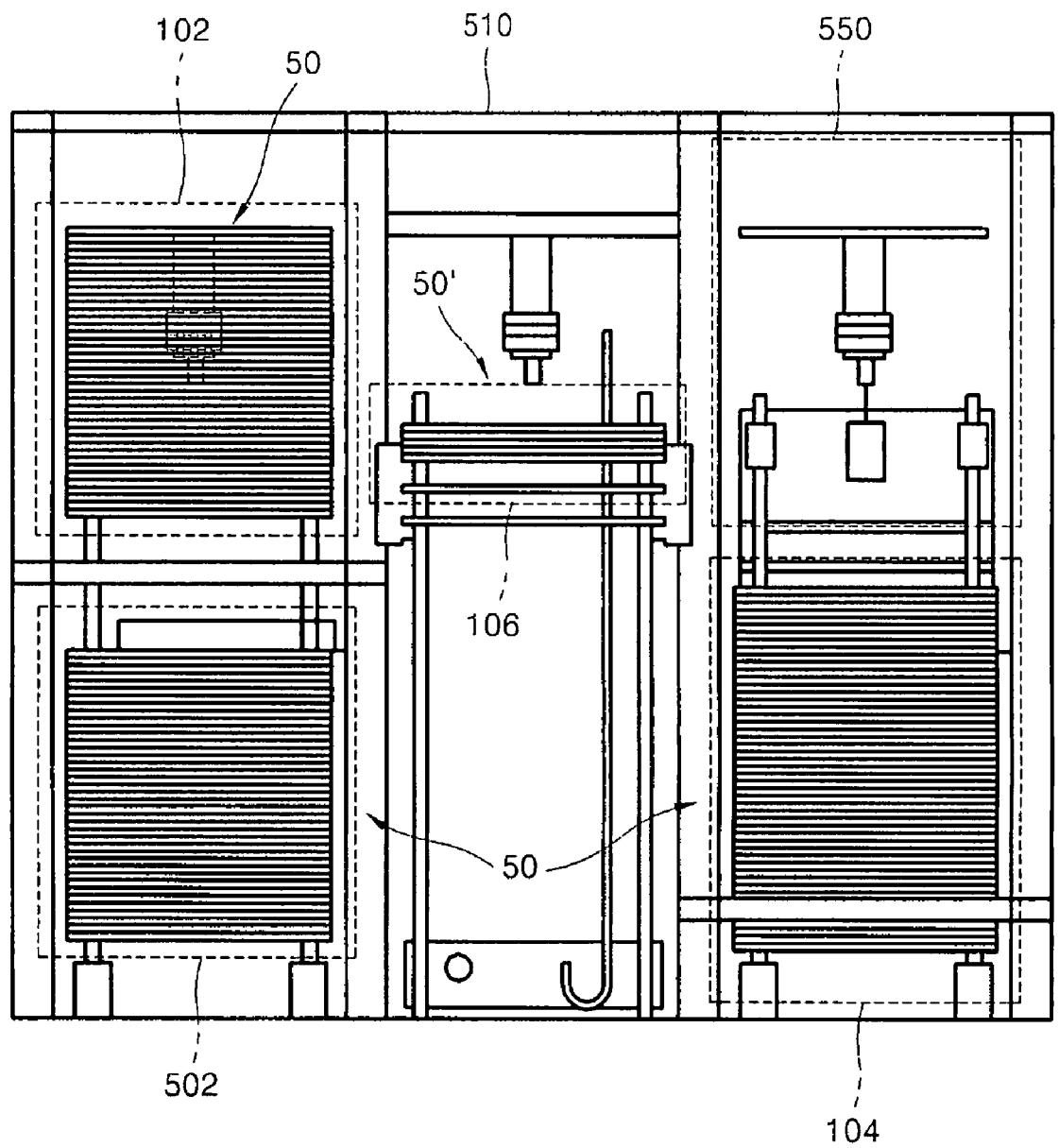
FIG. 4 is a front view of an embodiment of a semiconductor device processing section having a second buffer where an error tray is placed, according to aspects of the present invention.

FIG. 4 is a front view of an embodiment of the semiconductor device processing section 600 having a second buffer 106 (not shown in FIG. 3) where an error tray is placed in the semiconductor device processing section 600, according to aspects of the present invention.

Referring to FIG. 4, in this embodiment the semiconductor device processing section 600 further includes the second buffer 106, in addition to the loading station 102 of the loading unit 510, the sorting buffer 502, the unloading unit 550, and the loading buffer 104. The buffer positioned in the loading unit 510 includes the loading buffer 104, which is a first buffer where normal trays 50 are loaded and the second buffer 106 where error trays 50' are loaded. The error tray is one in which a semiconductor device is not properly placed.

Figure 1:
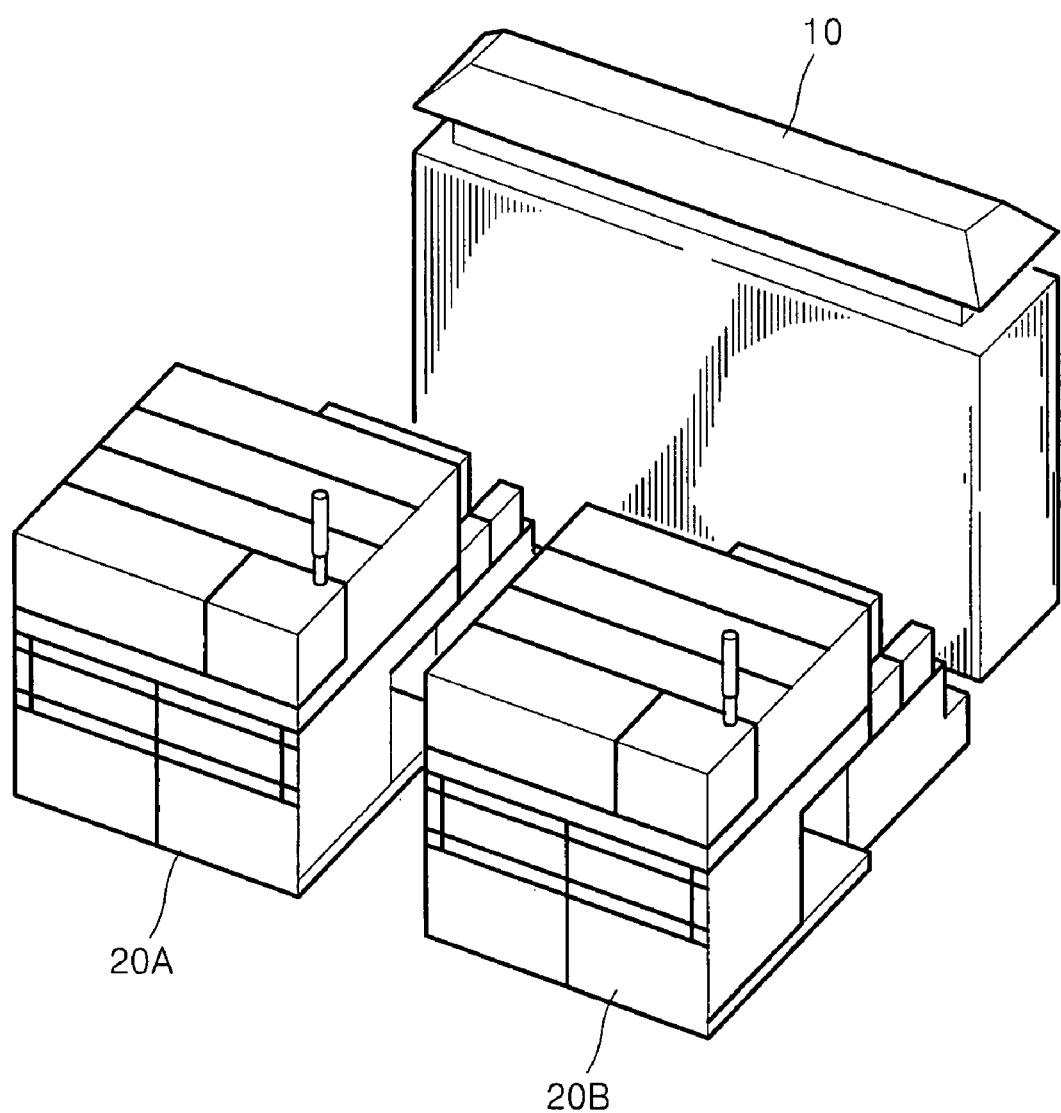
FIG. 1 is a perspective view of a prior art handler system.

In a prior art handler system, such as in FIG. 1, when a semiconductor device is not properly placed in the tray 50, the handler system generates an error signal to stop the operation of the handler. However, in accordance with aspects of the present invention, when one or more of a variety of possible error conditions occurs, e.g., a semiconductor device is not properly placed in the tray 50 or the RF tag included in the tray is not identified by the handler, the tray 50 is designated as an error tray 50' and transferred to the second buffer 106, without stopping the operation of the handler. The error trays 50' can be batch-processed later, thereby preventing the multifunctional handler system 1000 from being frequently stopped.

Figure 5:
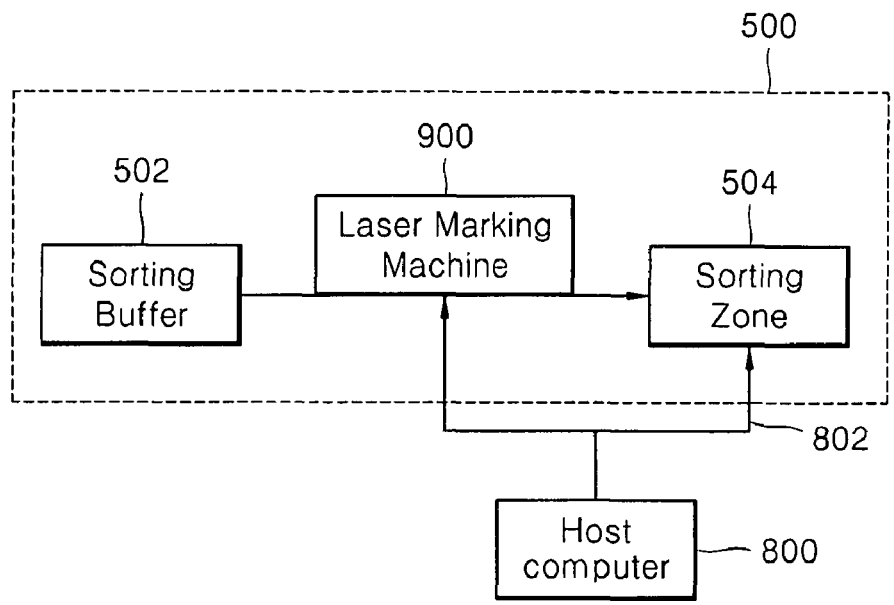
FIG. 5 is a block diagram of an embodiment of a sorting unit including a marking machine, within the semiconductor device processing section according to aspects of the present invention.

FIG. 5 is a block diagram of an embodiment of a sorting unit 500 including a marking machine 900, within the semiconductor device processing section 600, according to aspects of the present invention.

Referring to FIG. 5, in this embodiment the semiconductor device processing section 600 further includes the separate marking machine 900 in the sorting unit 500. The marking machine 900 can be installed at any position before the tray taken into the sorting unit 500 leaves the unloading unit 550 of FIG. 3, i.e., transferred from the semiconductor device processing section 600. In this embodiment, the marking machine 900 is positioned in the path through which the tray is transferred from the sorting buffer 502 to the sorting zone 504. The marking machine 900 is coupled to the host computer 800 through the signal line 802, thereby receiving the test results of the semiconductor device from the host computer 800 and marking the proper name of a corresponding product on the semiconductor device. The method of marking the proper name of the product can be implemented using a laser marking machine, as an example. The prior art handler system performs the loading, testing, sorting, and unloading of semiconductor devices, albeit differently than the multi-functional handler system 1000 described herein. However, unlike the prior art handler system, the multifunctional handler system 1000 for electrical testing of semiconductor devices according to aspects of the present invention has the merit of additionally marking the proper name of a product on a semiconductor device, based on the test results.

Figure 6:
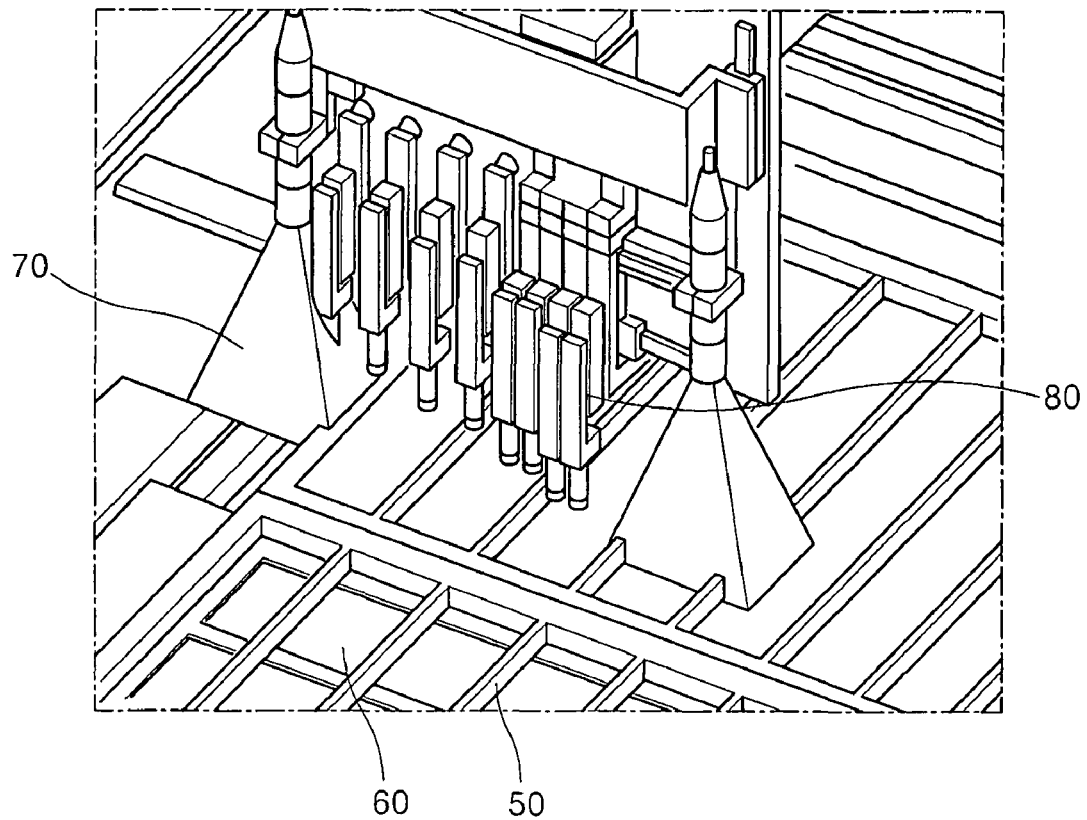
FIG. 6 is a perspective view of an embodiment of a tray error sensing unit positioned at the semiconductor device processing section, according to aspects of the present invention.
Figure 7:
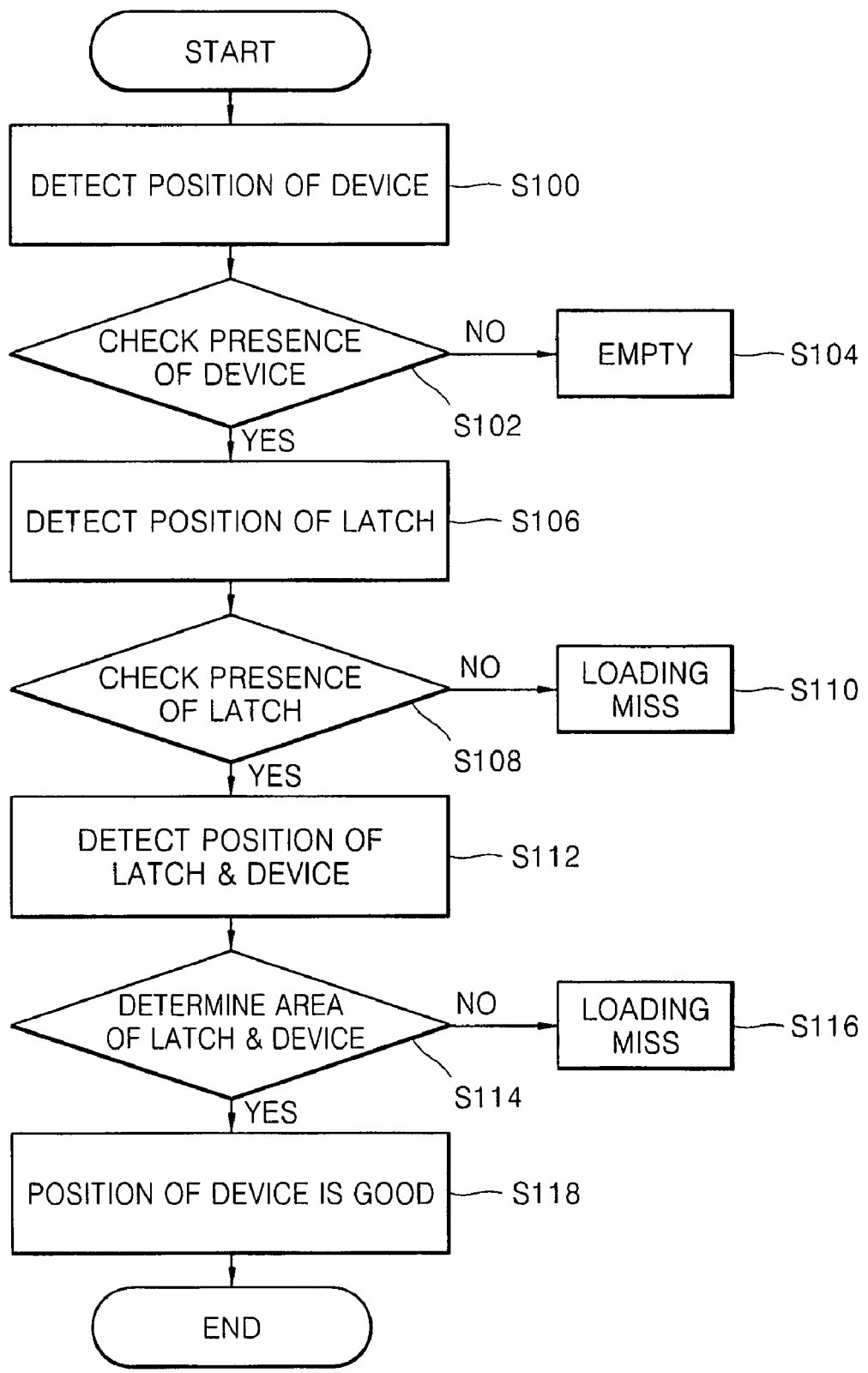
FIG. 7 is a flowchart of an embodiment of a method of operation of the tray error sensing unit of FIG. 6.

FIG. 6 is a perspective view of an embodiment of a tray error sensing unit 70 within the semiconductor device processing section 600, according to aspects of the present invention and FIG. 7 is a flowchart of an embodiment of a method of an operation of the tray error sensing unit 70 of FIG. 6.

Referring to FIGS. 6 and 7, in the semiconductor device processing section 600, the loading unit 510 performs a process of transferring the semiconductor devices from a customer tray to a test tray 50 and the sorting unit 500 sorts the semiconductor devices placed in the test tray 50 into good products and bad products according to the test results and transfers the sorted semiconductor devices, accordingly. Then, the loading unit 510 and the sorting unit 500 use pickers 80 to transfer semiconductor devices 60 in the tray 50. In accordance with this embodiment, the pickers 80 include an error sensing unit 70, for example, an image identification camera. In this embodiment, the image identification camera is used as the error sensing unit, but another sensor can be used as the error sensing unit.

When one of the pickers 80 used by the loading unit 510 and the sorting unit 500 releases or picks up the semiconductor device, the presence and position of the semiconductor device inside a pocket of the test tray 50 is first detected (S100, S102). If the semiconductor device is present in the pocket, it is processed normally to detect a latch position. If the semiconductor device is not present in the pocket, an "empty" signal is generated (S104). Each of the pockets is viewed as a cell in which one semiconductor device is placed, in the tray 50.

When there is no problem in determining the presence of the semiconductor device, the camera 70 installed in the picker 80 starts a latch position detection for checking whether the position and height of the semiconductor device in the pocket is normal (S106). If normal, the test process is performed, and if not normal, a "misload" signal is generated (S110). Based on the determination of the presence of the semiconductor device in the pocket and the presence of the latch, the camera 70 installed in the picker 80 checks the condition of the semiconductor device placed in the tray (S114). Any error in the condition of the semiconductor device loaded in the tray is identified (S118). If there is an error, a "misload" signal is generated (S116). The tray with misload is loaded into the second buffer 106 of FIG. 4 in the loading unit and is subsequently processed, as described above.

Figure 8:
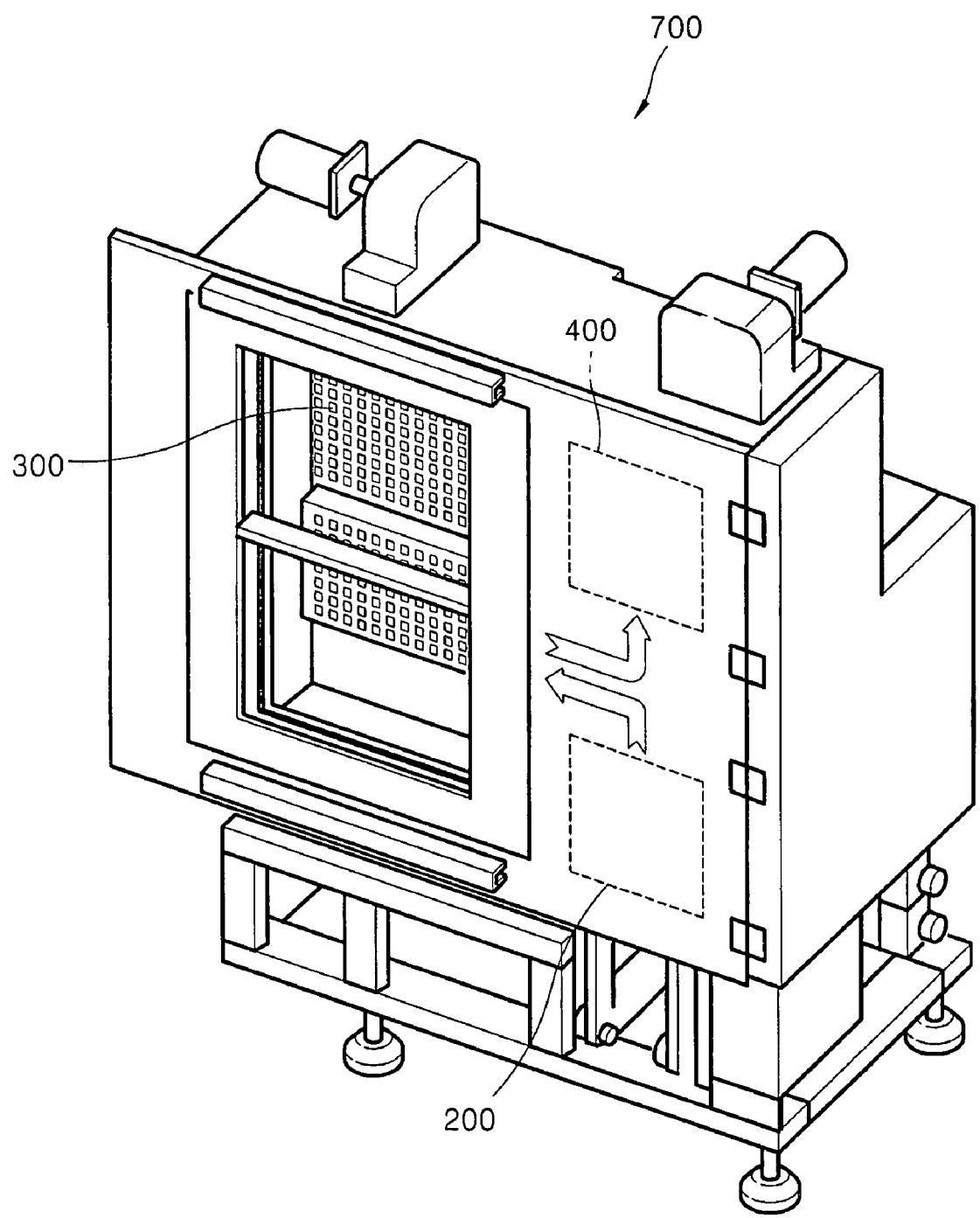
FIG. 8 is a perspective view of an embodiment of a semiconductor device testing section, according to aspects of the present invention.

FIG. 8 is a perspective view of an embodiment of the semiconductor device testing section 700, according to aspects of the present invention.

Referring to FIG. 8, the semiconductor device testing section 700 comprises a soak chamber 200, a test chamber 300, and a de-soak chamber 400. In the soak chamber 200, the semiconductor device loaded in the tray by the loading unit 510 is aged at a predetermined temperature. In the test chamber 300, the semiconductor device is tested. The de-soak chamber 400 is positioned to be adjacent to and aligned with the soak chamber 200, and is used to return the semiconductor device to normal temperature after the test.

The soak chamber 200 and the de-soak chamber 400 are installed adjacent to the test chamber 300 and transfer the tray in the directions indicated by the arrows. For example, if the soak-chamber 200 and the de-soak chamber 300 are disposed along a first axis, the test chamber 400 can be disposed along a second axis substantially perpendicular to the first axis. However, in the prior art handler system, the soak chamber 200, the test chamber 300 and the de-soak chamber 400 are arranged along a single axis. Therefore, when the tray is taken out of the de-soak chamber 400 after a high-temperature test, the single-axis arrangement of the soak chamber 200, the test chamber 300 and the de-soak chamber 400 causes the temperature of the test chamber 300 to drop momentarily.

In the present invention, the soak chamber 200 and the de-soak chamber 400 are arranged close to each other and along the same axis, thereby reducing the change in the temperature of the test chamber 300 when the tray is transferred to and from the test chamber 300.

Figure 9:
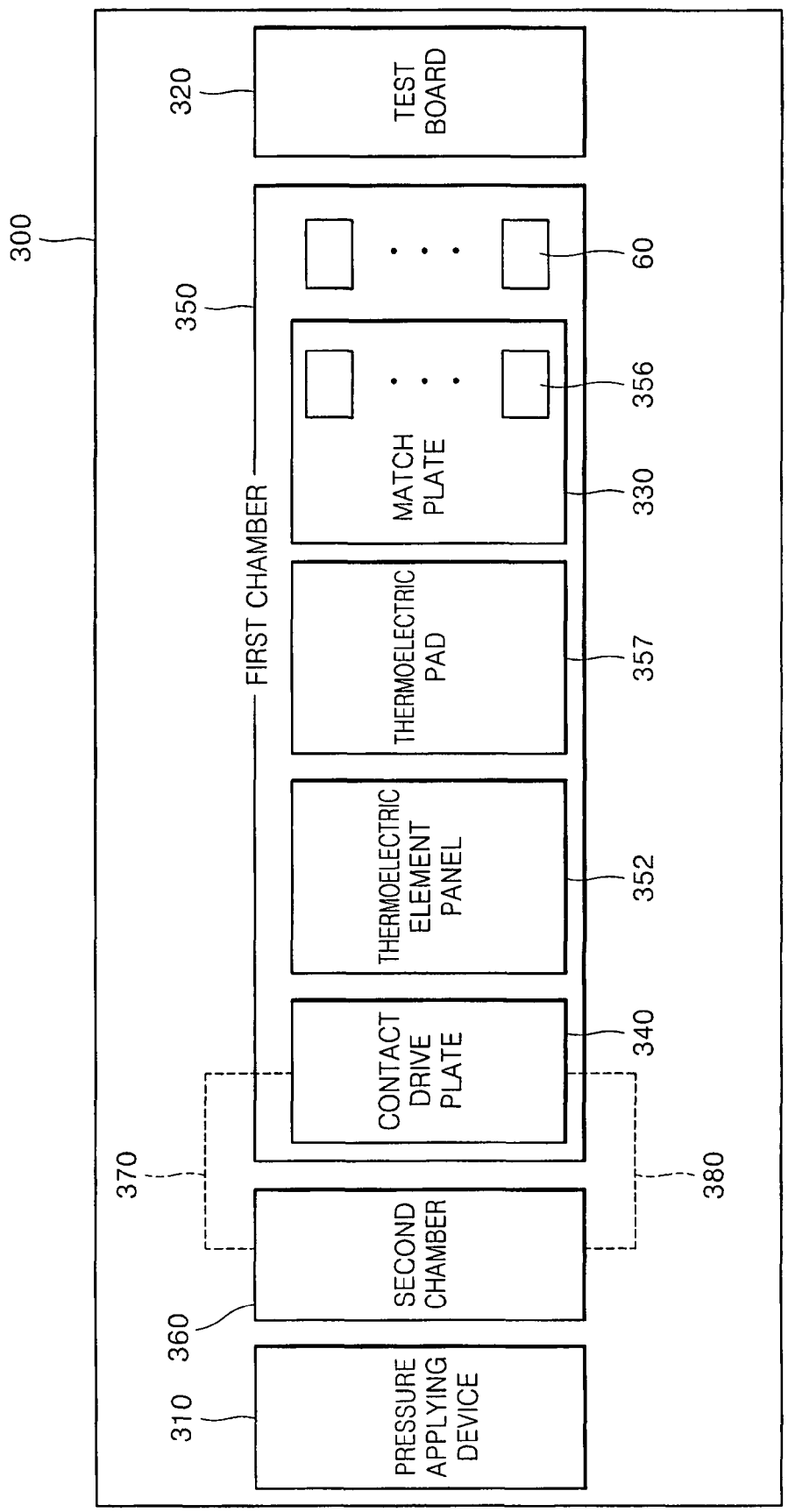
FIG. 9 is a block diagram of an embodiment of a test chamber in the semiconductor device testing section, according to aspects of the present invention.

FIG. 9 is a block diagram of an embodiment of a test chamber 300 in the semiconductor device testing section 700, according to aspects of the present invention.

Referring to FIG. 9, the test chamber 300 includes two or more pressure applying devices 310 positioned at a distal end of the test chamber 300. The pressure applying device 310 is a mechanical structure configured to press the semiconductor device in the test tray placed on a test board 320 so that the semiconductor device is electrically connected to the test board 320.

A second chamber 360 is positioned adjacent to the pressure applying device 310, and a first chamber 350 is positioned adjacent to the second chamber 360. The second chamber 360 contains a medium for controlling temperature, for example, ethanol, which is a liquid coolant. The liquid coolant is supplied to the first chamber 350 through a first pipeline 370 and is collected through a second pipeline 380. When a plurality of semiconductor devices, for example, 512, 1024 or more, are tested, a large amount of heat is generated. In such a case, the first and second pipelines 370 and 380 can quickly remove the heat.

A path through which the heat generated by the plurality of semiconductor devices 60 connected to the test board 320 is emitted to the second chamber 360 will be described. The heat generated by the semiconductor devices 60 is transferred to semiconductor device heat emitting units 356 included in a match plate 330. The semiconductor device heat emitting unit 356 can be formed of a highly conductive metal, for example, aluminum. The match plate 330 is a housing structure configured to thermally couple the semiconductor device heat emitting units 356 to corresponding ones of semiconductor devices to be tested.

Subsequently, the heat transferred to the match plate 330 is transferred to a thermoelectric element panel 352 through a thermoelectric pad 357. The thermoelectric element panel 352 is comprised of a material having a Peltier effect. This phenomenon occurs when a current is passed through two or more dissimilar metals that are connected to one another at their junctions, and one junction generates heat while the other junction absorbs heat. An antimony-bismuth junction is the typical metal junction configured to achieve the Peltier effect, but other later developed materials may also suffice. The heat transferred to the thermoelectric element panel 352 is transferred to a contact drive plate 340 and then to the second chamber 360 through the liquid coolant of the second pipeline 380, to be emitted in the air.

The thermoelectric pad 357 then transfers the heat and absorbs the pressure applied to the semiconductor devices 60 by the pressure applying device 310. The material of the thermoelectric pad 357 can be silicon thermal conductive paste, thermal grease, or heat transfer compound, as examples.

Figure 10:
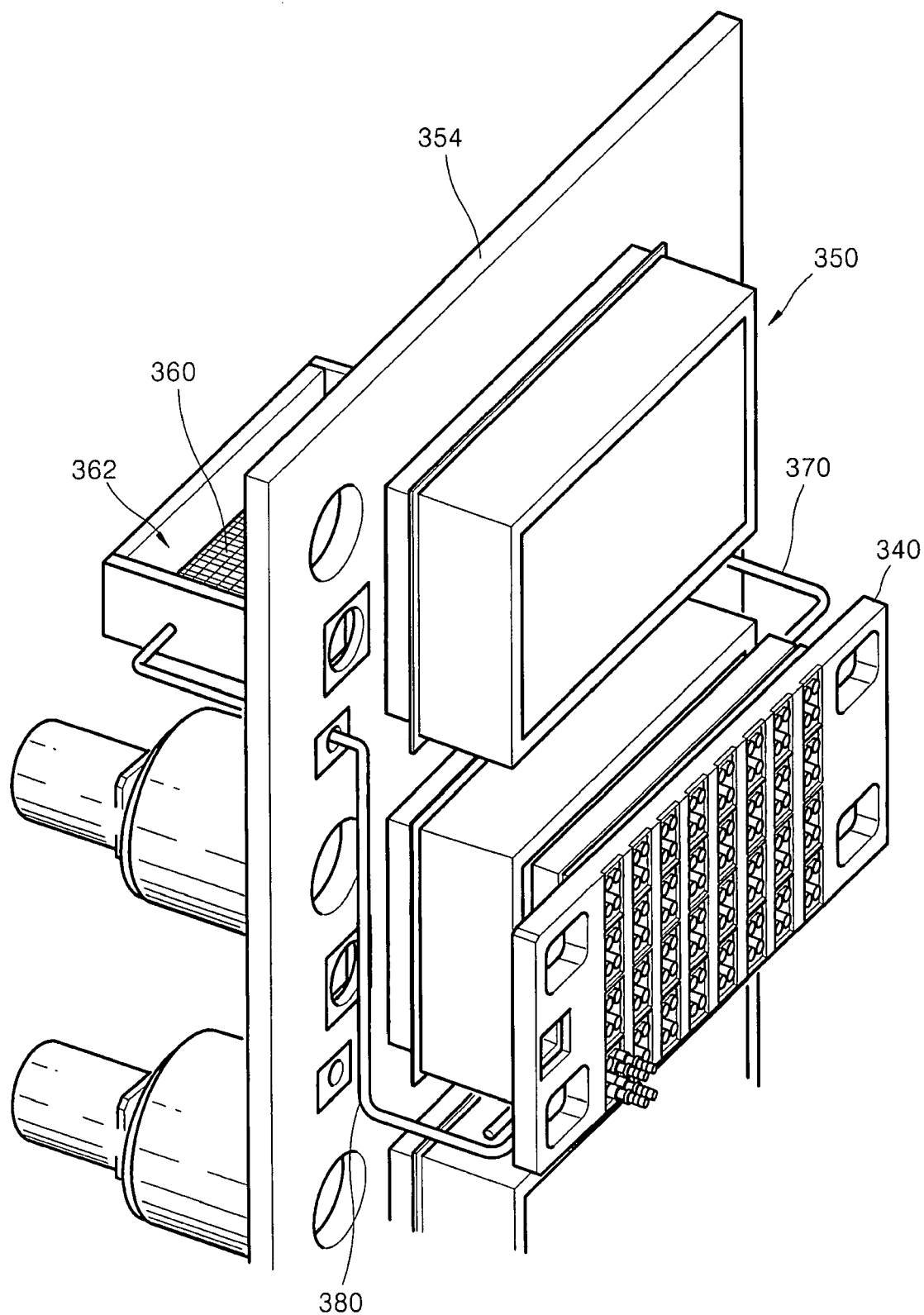
FIG. 10 is a perspective view of embodiments of a first chamber and a second chamber in the test chamber, according to aspects of the present invention.

FIG. 10 is a perspective view of embodiments of the first chamber and the second chamber in the test chamber according to aspects of the present invention.

Referring to FIG. 10, the second chamber 360, a first chamber sidewall 354, the first chamber 350, and the contact drive plate 340 are disposed adjacent to each other. FIG. 10 illustrates the second chamber 360 partially cut away, to show its interior structure. The thermoelectric element panel (not shown) is positioned behind the contact drive plate 340.

In this embodiment, since an air-cooling flow is present inside the test chamber, and the thermoelectric element panel is separately positioned adjacent to the portion where heat is generated by the semiconductor devices, the heat generated during the test is drawn out by the Peltier effect and emitted to the outside through the first and second pipelines 370 and 380. To effectively emit the heat external to the test space, a heat sink 362 can be additionally used inside the second chamber 360.

Figure 11:
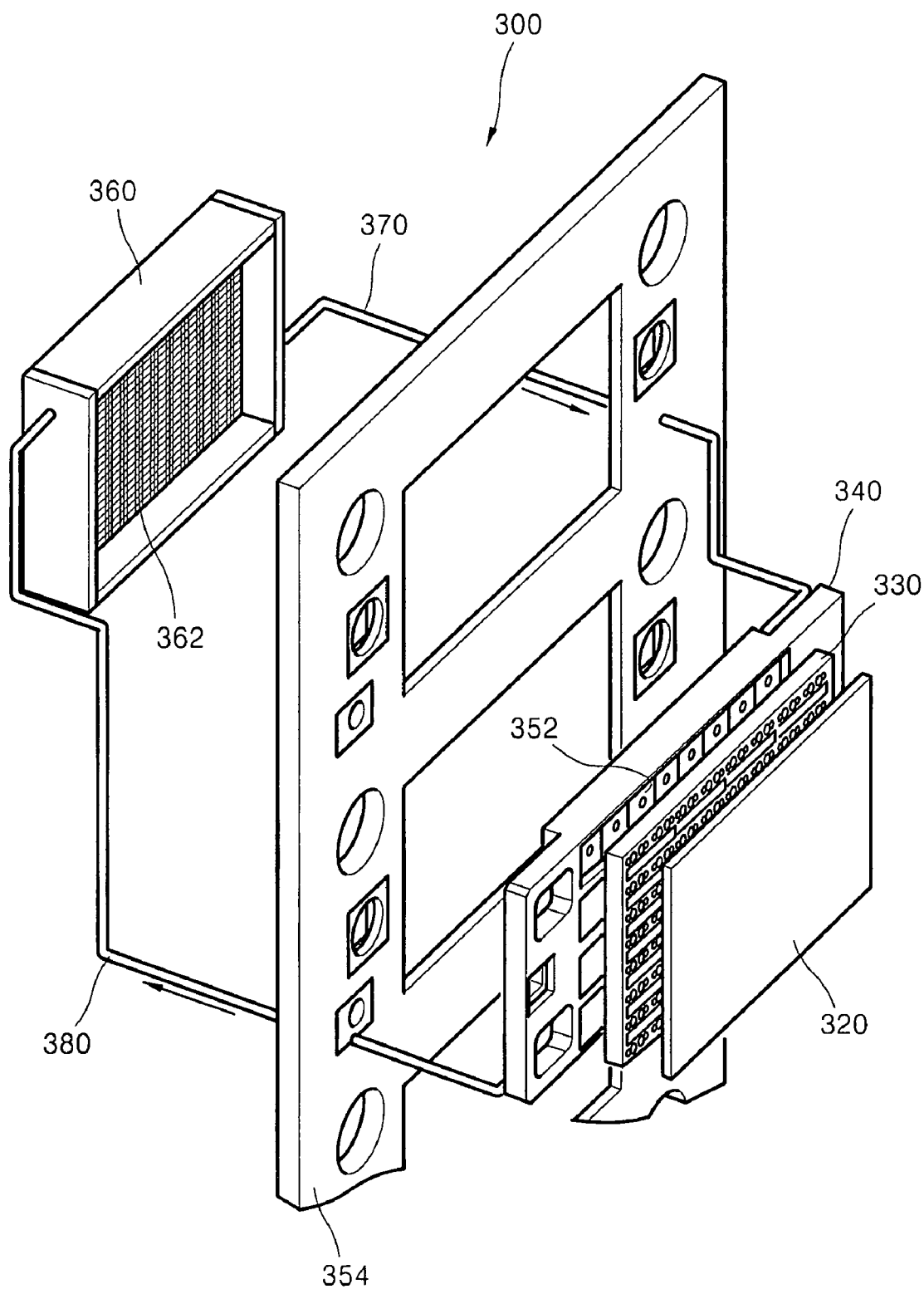
FIG. 11 is an exploded perspective view of an embodiment of a pipeline in the test chamber, according to aspects of the present invention.

FIG. 11 is an exploded perspective view of an embodiment of the pipelines in the test chamber, according to aspects of the present invention.

Referring to FIG. 11, the pipelines are divided into the first pipeline 370 used to supply the liquid coolant of the second chamber 360 to the contact drive plate 340 in the first chamber, and the second pipeline 380 used to collect the liquid coolant from the contact drive plate 340 of the first chamber. In FIG. 11, reference numeral 354 indicates the first chamber sidewall and reference numeral 320 indicates the test board placed on the match plate 330.

The liquid coolant can move through the first and second pipelines 370 and 380 between the first chamber 350 and the second chamber 360 by natural convection caused by the temperature difference. A circulating pump can be additionally used to forcibly circulate the liquid coolant if necessary. The heat sink 362 used in the second chamber 360 can be positioned in other orientations as useful to maximize the emission effect, different from that shown in FIG. 10.

In this embodiment, ethanol is used as the liquid coolant, but any other kind of liquid coolant can be used. The heat sink 362 is a three-dimensional structure having a pin shape, in order to have a large surface area to emit heat, but it can also be formed in different shapes. The heat sink 362 is air cooled but can also be cooled by liquid nitrogen or water, as examples.

In the test chamber 300 in the semiconductor device testing section, even though a great amount of heat is generated during the parallel electrical test of the semiconductor devices, the primary temperature control is performed by the circulation of the air in the test space, and additional temperature control is performed using the Peltier effect in the thermoelectric element panel positioned adjacent to the test board 320, and final temperature control is performed using the liquid coolant through the first and second pipelines 370 and 380 connected to the first and second chambers 350 and 360. Accordingly, the heat is promptly dispersed from the separate test space in the test chamber 300, thereby maintaining a substantially constant temperature. This method of controlling the temperature of the test chamber 300 is more effective for a parallel handler for testing memory semiconductor devices, when 256 or more memory semiconductor devices are tested in parallel.

Figure 12:
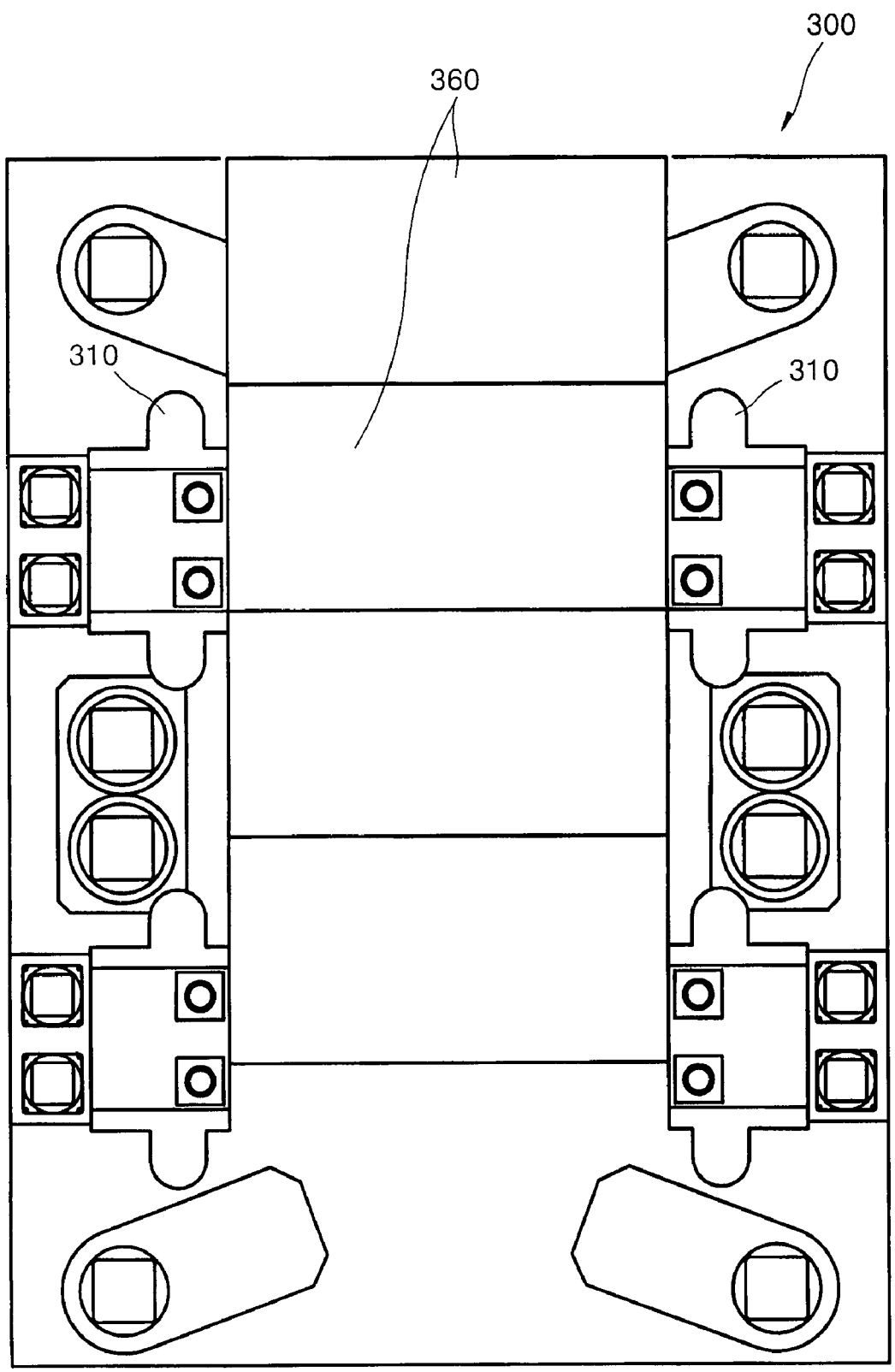
FIG. 12 is a rear view of the second chamber of FIG. 10 in the test chamber, according to aspects of the present invention.

FIG. 12 is a rear view of an embodiment of the second chamber 360 in the test chamber 300, according to aspects of the present invention.

Referring to FIG. 12, the test chamber 300 includes two or more test spaces. The test chamber 300 illustrated in FIG. 12 includes four test spaces. The temperature of each separate test space is controlled by the liquid coolant by the first chamber and the second chamber 360. Reference numeral 310 indicates the pressure applying device, positioned behind the second chamber, for pressing the semiconductor device, as described above.

Figure 13:
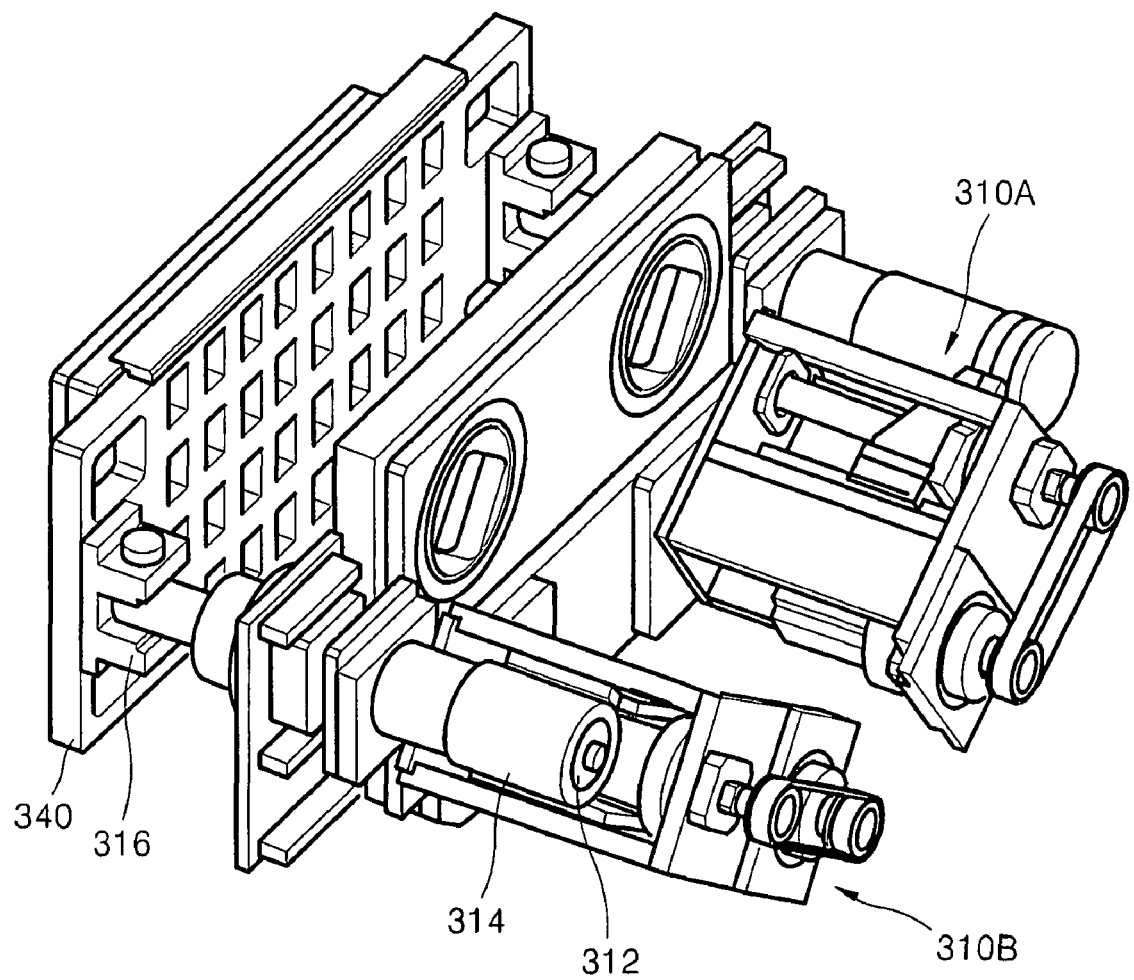
FIG. 13 is a perspective view of an embodiment of a pressure-applying device of the test chamber, according to aspects of the present invention.

FIG. 13 is a perspective view of an embodiment of the pressure applying device 310 of the test chamber 300 according to aspects of the present invention.

Referring to FIG. 13, two or more pressure applying devices 310A and 310B can be used. Compared to the prior art handler system, which uses only one pressure applying device, the handler system according to the present invention can reliably connect many semiconductor devices to the test board. The pressure applying devices 310A and 310B are protected by heat insulators 314 to protect them from the high temperature. Inside the heat insulator 314, a resultant force measuring device 312 is included to measure the resultant force applied by the pressure applying devices 310A and 310B. References 316 and 340 respectively indicate a pressure shaft connecting device and a contact drive plate.

A first advantage of the multifunctional handler system for electrically testing semiconductor devices according to aspects of the present invention is that the semiconductor device processing section and the semiconductor device testing section are separate from each other in the handler and are connected to the host computer, so that the handler is easily fixed and the test efficiency is enhanced.

Second, when the semiconductor devices are sorted in the handler, the separately installed marking machine directly marks the names of products, which increases the function of the handler.

Third, since the loading unit uses the second buffer to hold trays with errors inside the handler, the downtime of the handler is reduced.

Fourth, the test: chamber is separated into two or more test spaces and the first and second pipelines are connected to each test space, to maintain a constant temperature inside the test chamber even when many semiconductor devices are tested.

While the present invention has been particularly shown and described with reference to exemplary embodiments thereof, it will be understood by those of ordinary skill in the art that various changes in form and detail can be made therein without departing from the spirit and scope of the present invention as defined by the following claims.

What is claimed is:

1. A multifunctional handler system for electrically testing semiconductor devices, comprising:
a semiconductor device processing section including:
a loading unit having a separate buffer configured to receive trays of semiconductor devices;
a sorting unit adjacent to the loading unit and configured to sort a set of semiconductor devices in a tray after testing, and
an unloading unit configured to unload the sorted semiconductor devices from the tray and external to the semiconductor device processing section;
a semiconductor device testing section configured to test the set of semiconductor devices in the test tray, separate from the semiconductor device processing section, that includes a test chamber configured to perform parallel testing of the semiconductor devices, the test chamber is separated into two or more test spaces, wherein each of the test spaces includes a first chamber positioned adjacent to a second chamber and pipelines connecting the first and second chambers to each other; and
a host computer coupled to the semiconductor device processing section and the semiconductor device testing section and configured to control tray information, test results, marking information, and test program information.

2. The multifunctional handler system of claim 1, wherein the loading unit is configured to enable the trays to be received using a 'first in, first out' sequence.

3. The multifunctional handler system of claim 1, wherein the separate buffer positioned in the loading unit comprises:
a first buffer where normal trays are loaded; and
a second buffer where trays with an error occurring during a process of loading the semiconductor devices into the trays are loaded.

4. The multifunctional handler system of claim 1, wherein the unloading unit of the semiconductor device processing section is configured to enable trays to be received using a 'first in, first out' sequence.

5. The multifunctional handler system of claim 1, wherein the two or more test spaces of the test chamber are formed by a partition composed of a heat insulating material.

6. The multifunctional handler system of claim 1, wherein the loading unit and the sorting unit comprise a tray error sensing unit configured to sense a tray error, the tray error sensing unit disposed in a path through which the trays are transferred.

7. The multifunctional handler system of claim 6, wherein the tray error sensing unit comprises at least one of a camera and a sensor.

8. The multifunctional handler system of claim 1, wherein the sorting unit further comprises a marking machine configured to mark a proper product name on each of the set of semiconductor devices in the tray and to receive test results corresponding to the semiconductor devices, from the host computer.

9. The multifunctional handler system of claim 8, wherein the marking machine is a laser marking machine.

10. The multifunctional handler system of claim 1, wherein the semiconductor device testing section further comprises:
a soak chamber configured to age the semiconductor devices in one or more trays loaded by the loading unit, at a predetermined temperature;
a test chamber configured to test the semiconductor devices in the one or more trays aged in the soak chamber; and
a de-soak chamber, adjacent to and aligned with the soak chamber , and configured to return the semiconductor devices in the one or more trays tested in the test chamber to a normal temperature.

11. The multifunctional handler system of claim 1, wherein the test chamber further comprises:
the second chamber positioned at a lower position, where a liquid coolant is circulated;
the first chamber positioned above the second chamber and connected to the second chamber through first and second pipelines, the first chamber including a contact drive plate, a thermoelectric element panel, a thermoelectric pad, and a match plate;
a test board positioned adjacent to the first chamber; and
at least one pressure applying device, positioned adjacent to the second chamber and configured to press the semiconductor devices loaded on the test board.

12. The multifunctional handler system of claim 11, wherein the liquid coolant is ethanol.

13. The multifunctional handler system of claim 11, wherein the thermoelectric element panel of the first chamber is composed of a material producing the Peltier effect.

14. The multifunctional handler system of claim 11, wherein the second chamber further comprises a heat sink configured to emit heat external to the test chamber.

15. The multifunctional handler system of claim 11, wherein a medium is moved through the first and second pipelines of the test chamber, using a temperature difference of the medium.

16. The multifunctional handler system of claim 11, wherein the pipelines of the test chamber include:
a first pipeline configured to supply a medium at a predetermined temperature from the second chamber to the contact drive plate adjacent to the first chamber; and
a second pipeline configured to return the medium from the contact drive plate adjacent to the first chamber to the second chamber.

17. The multifunctional handler system of claim 11, wherein the at least one pressure applying device is two or more.

18. The multifunctional handler system of claim 1, wherein the semiconductor device processing section further comprises a tray transferring unit connecting the semiconductor device processing section to the semiconductor device testing section.

19. The multifunctional handler system of claim 18, wherein the tray transferring unit is a conveyer system.

20. The multifunctional handler system of claim 1, wherein the semiconductor device testing section further comprises a tray transferring unit connecting the semiconductor device testing section to the semiconductor device processing section.

21. The multifunctional handler system of claim 20, wherein the tray transferring unit is a conveyer system.

* * * * *